United States Patent
Edahiro

(10) Patent No.: US 8,325,545 B2
(45) Date of Patent: Dec. 4, 2012

(54) NONVOLATILE SEMICONDUCTOR MEMORY DEVICE

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,760

(22) Filed: Sep. 16, 2011

(65) Prior Publication Data

US 2012/0092931 A1  Apr. 19, 2012

(30) Foreign Application Priority Data

Oct. 13, 2010 (JP) ................................. 2010-230987

(51) Int. Cl.
*G11C 7/00* (2006.01)

(52) U.S. Cl. ............. 365/195; 365/185.28; 365/185.03; 365/185.29

(58) Field of Classification Search .................. 365/195, 365/185.28, 185.03, 185.29
See application file for complete search history.

(56) References Cited

U.S. PATENT DOCUMENTS 6,643,188 B2   11/2003  Tanaka et al.
2009/0147598 A1*  6/2009  Norman ........................ 365/200

FOREIGN PATENT DOCUMENTS

JP        7-93979       4/1995
JP     2003-196988     7/2003

OTHER PUBLICATIONS

Office Action issued Feb. 7, 2012, in Japanese Patent Application No. 2010-230987 with English translation.

* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array, threshold voltages of memory cells being set lowest in an erase state and sequentially set higher according to data in a program state, a plurality of bit lines connected to the memory cells, a word line connected to the memory cells, and a control circuit. In a case where a first memory cell is programmed to a first threshold voltage that is lowest among threshold voltages in the program state, the control circuit is configured to charge a first bit line connected to the first memory cell to a third voltage between a first voltage applied to a bit line when a memory cell is programmed to a second threshold voltage higher than the first threshold voltage and a second voltage applied to a bit line when a memory cell is inhibited from being programmed.

16 Claims, 8 Drawing Sheets

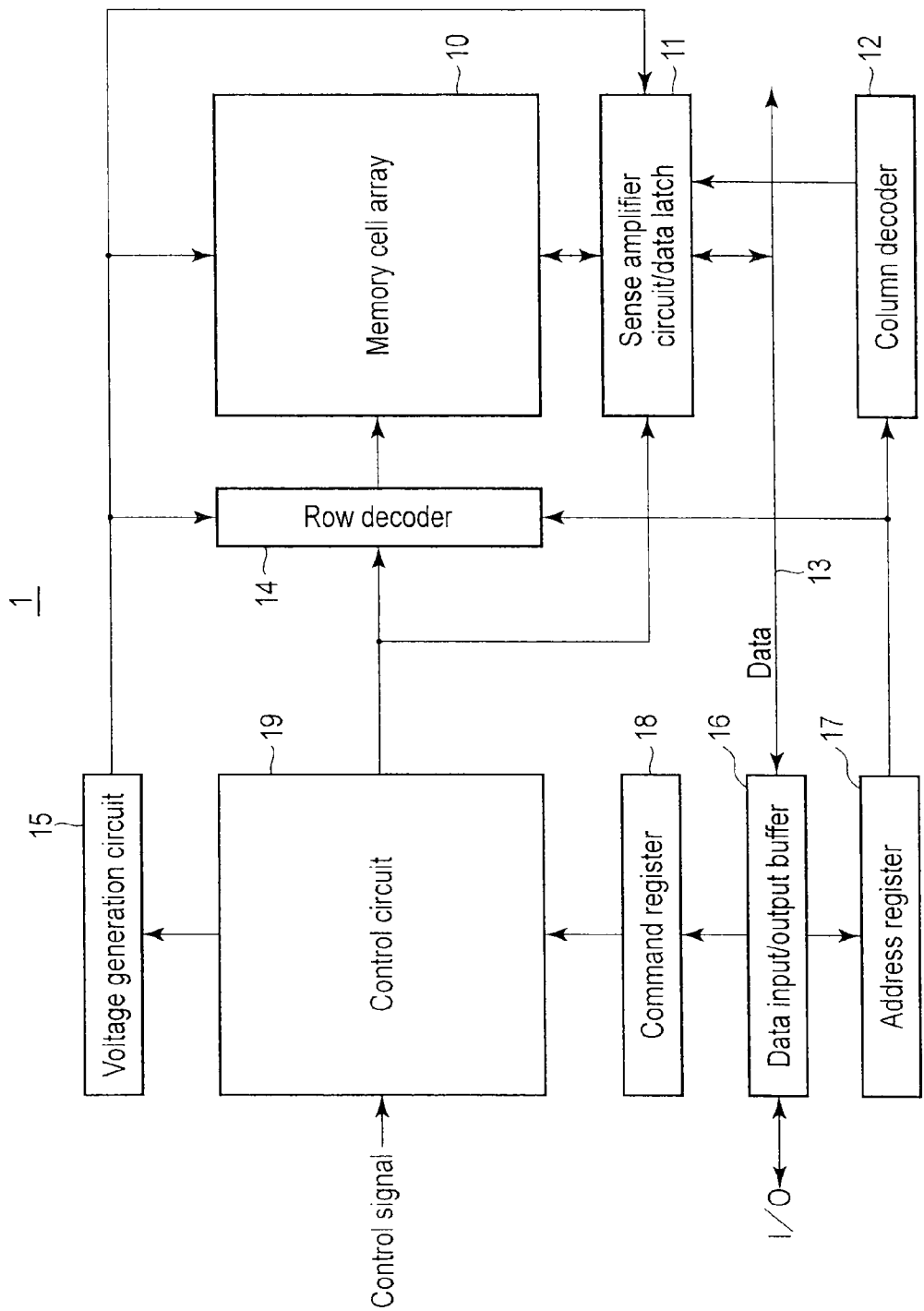
F I G. 1

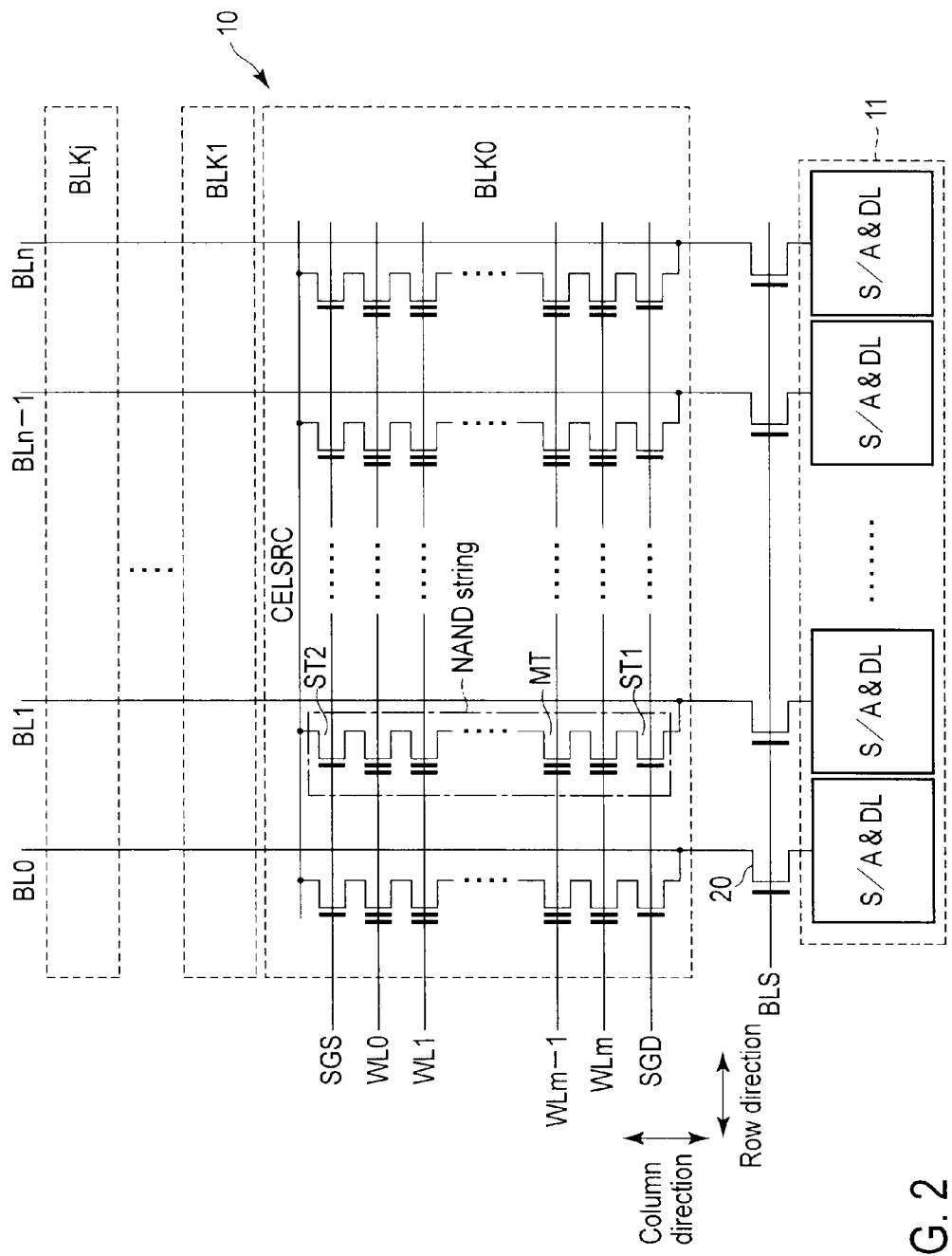
F I G. 2

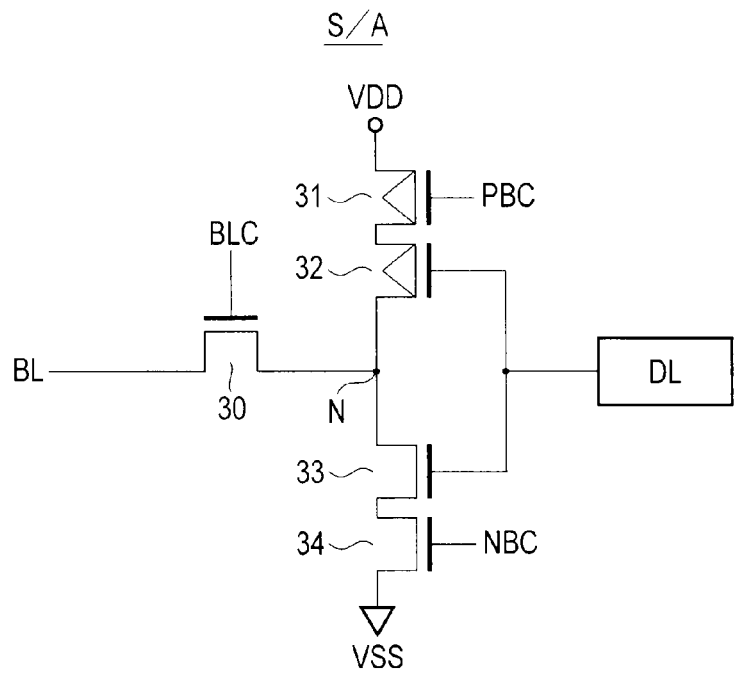
F I G. 5
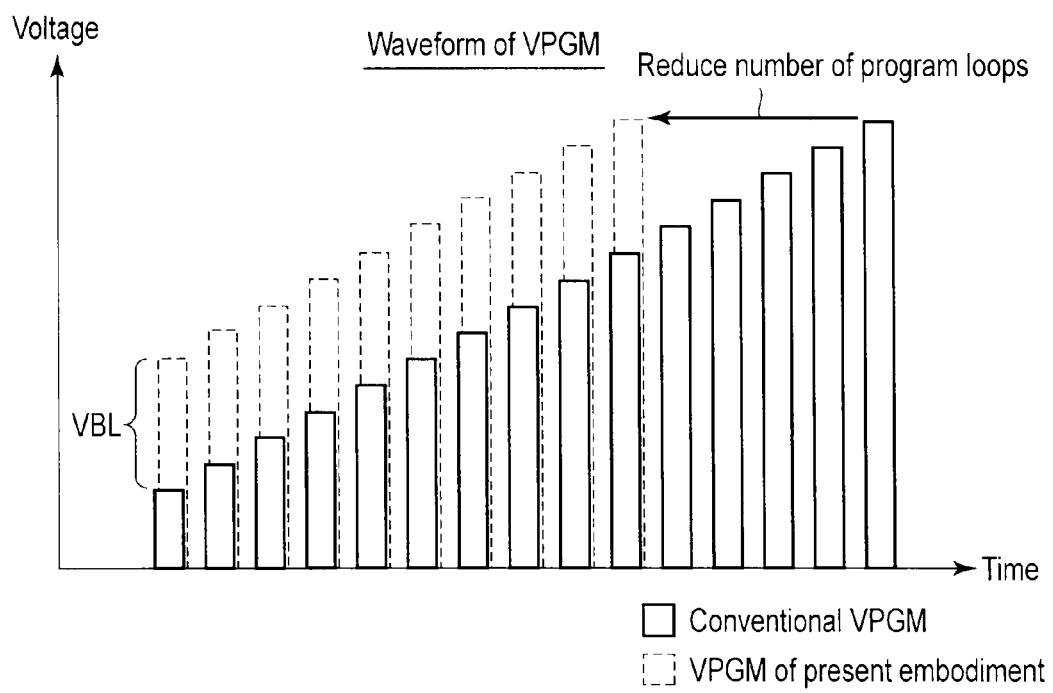
F I G. 6

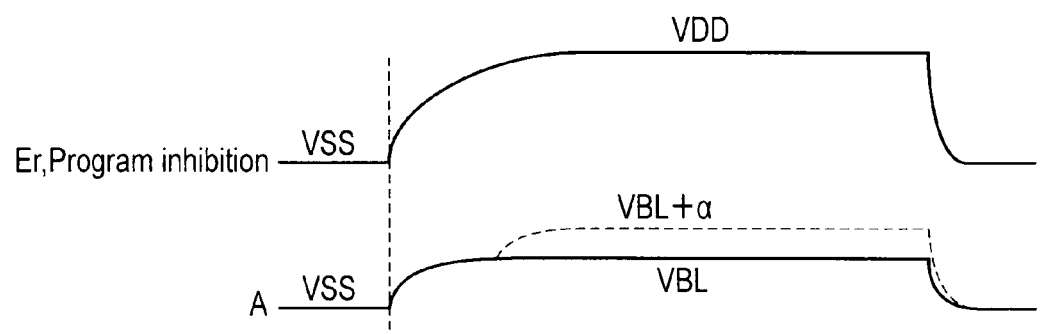
F I G. 7
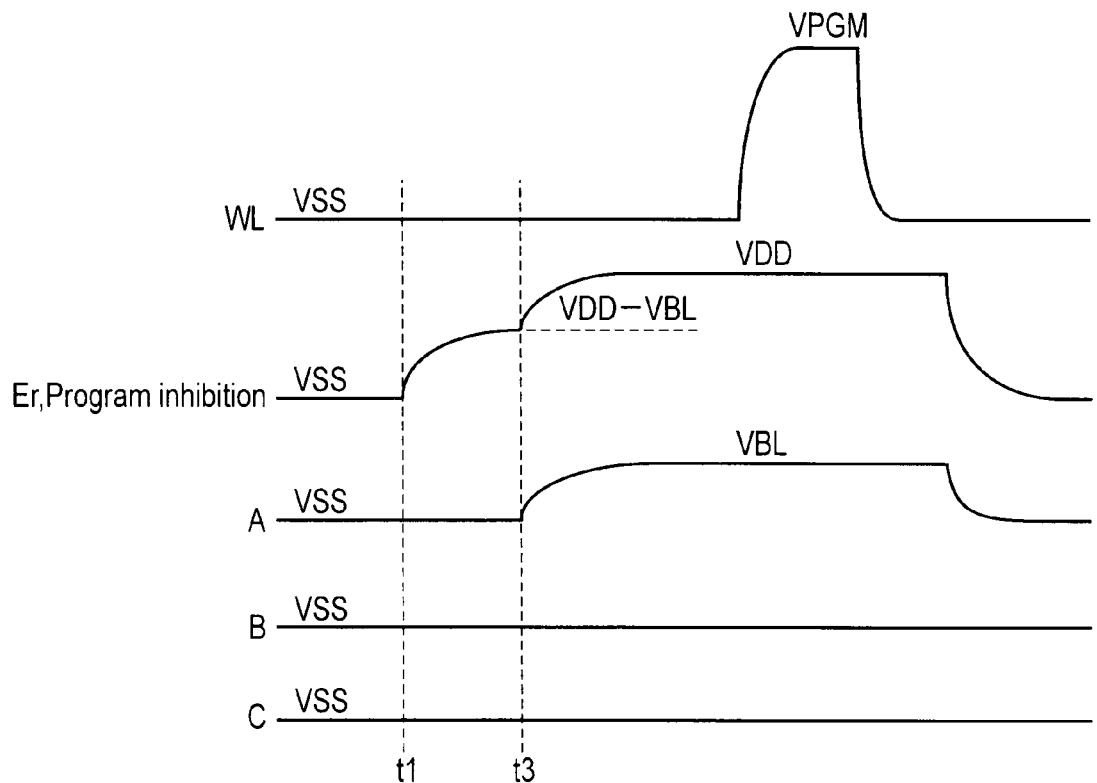
F I G. 8

US 8,325,545 B2

NONVOLATILE SEMICONDUCTOR MEMORY DEVICE

CROSS-REFERENCE TO RELATED APPLICATIONS

This application is based upon and claims the benefit of priority from prior Japanese Patent Application No. 2010-230987, filed Oct. 13, 2010, the entire contents of which are incorporated herein by reference.

FIELD

Embodiments described herein relate generally to a nonvolatile semiconductor memory device.

BACKGROUND

A NAND flash memory is known as one type of a nonvolatile semiconductor memory device. Each of the memory cells of the NAND flash memory includes a charge storage layer and the threshold voltage thereof varies according to a charge amount injected into the charge storage layer and data is stored according to a difference in the threshold voltage. Further, the memory cell can store a plurality of bits by finely dividing the threshold voltage distribution.

In the NAND flash memory, recently, a variation occurs in the program characteristic due to a variation in the amount of impurities contained in the channel and a variation in the shape of the memory cell as the memory cells are further miniaturized, and the program performance tends to be degraded and the final threshold distribution width tends to become larger. The most basic method for improving deterioration in the threshold distribution is to set a step-up voltage of a program voltage applied to a word line at the program time to a smaller value. The threshold voltage variation amount of the memory cell for each program can be suppressed by reducing the step-up voltage and the final threshold distribution width can be finely divided.

However, when a small step-up voltage is used, a larger number of program loops are required to program all of the memory cells and, as a result, the program speed will be lowered.

BRIEF DESCRIPTION OF THE DRAWINGS

FIG. 1 is a block diagram showing the configuration of a NAND flash memory 1 according to a first embodiment;

FIG. 2 is a circuit diagram showing the configuration of a memory cell array 10;

FIG. 5 is a circuit diagram showing one example of sense amplifier S/A;

FIG. 6 is a diagram illustrating the effect of reducing the number of program loops;

FIG. 7 is a timing chart illustrating bit line voltages according to a comparison example;

FIG. 8 is a timing chart illustrating bit line voltages in the program operation according to a second embodiment;

DETAILED DESCRIPTION

Figure 3:
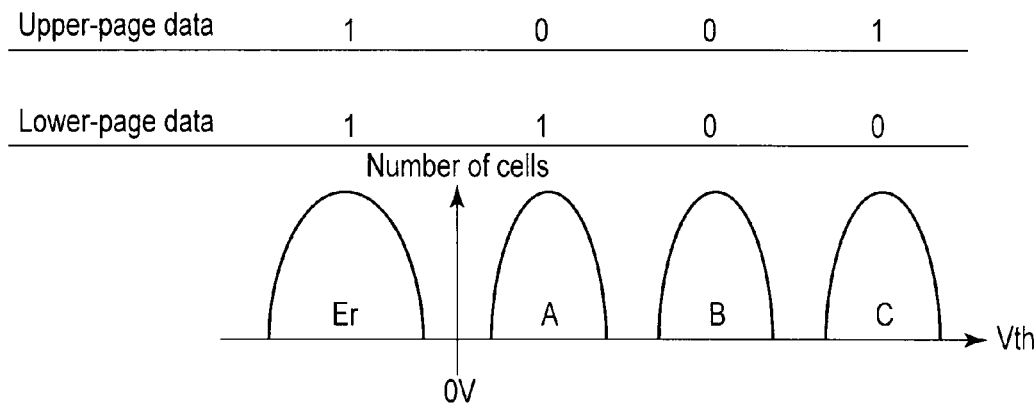
FIG. 3 is a diagram illustrating the threshold voltage distribution of memory cells.

In general, according to one embodiment, there is provided a nonvolatile semiconductor memory device comprising: a memory cell array including a plurality of memory cells configured to store a plurality of bits, threshold voltages of the memory cells being set lowest in an erase state and sequentially set higher according to data in a program state; a plurality of bit lines connected to the memory cells; a word line connected to the memory cells; and in a case where a first memory cell is programmed to a first threshold voltage that is lowest among threshold voltages in the program state, a control circuit configured to charge a first bit line connected to the first memory cell to a third voltage between a first voltage applied to a bit line when a memory cell is programmed to a second threshold voltage higher than the first threshold voltage and a second voltage applied to a bit line when a memory cell is inhibited from being programmed.

The embodiments will be described hereinafter with reference to the accompanying drawings. In the description which follows, the same or functionally equivalent elements are denoted by the same reference numerals, to thereby simplify the description.

[First Embodiment]

FIG. 1 is a block diagram showing the configuration of a NAND flash memory (nonvolatile semiconductor memory device) 1 according to a first embodiment. The NAND flash memory 1 includes a memory cell array 10, sense amplifier circuit 11, column decoder 12, data bus 13, row decoder 14, voltage generation circuit 15, data input/output buffer 16, address register 17, command register 18 and control circuit 19.

The memory cell array 10 is configured by arranging electrically erasable and programmable memory cells in a matrix form. In the memory cell array 10, a plurality of bit lines BL extending in a column direction, a plurality of word lines WL extending in a row direction and a plurality of source lines CELSRC extending in the row direction are arranged.

Bit lines BL are connected to the sense amplifier circuit 11. The sense amplifier circuit 11 controls voltages of bit lines BL to perform data erase of a memory cell, data write (program) to a memory cell and data read from a memory cell. In order to perform the above operations, the sense amplifier circuit 11 includes a data latch that stores read data, write data and the like.

The column decoder 12 controls the connection between the sense amplifier circuit 11 and bit lines BL and controls transfer of data between the sense amplifier circuit 11 and the data bus 13.

Word lines WL are connected to the row decoder 14. The row decoder 14 selects one of word lines WL and applies various voltages required for erase, program and read to word lines WL. In order to perform the above operation, the row decoder 14 includes a word line drive circuit.

The voltage generation circuit 15 raises or lowers a power source voltage to generate various voltages used in the memory cell array 10, sense amplifier circuit 11 and row decoder 14.

The data input/output buffer 16 is connected to the external (for example, host device) via an I/O line and performs operations of receiving write data, outputting read data and receiving an address and command. The data input/output buffer 16 sends received write data to the sense amplifier circuit 11 via the data bus 13 and receives read data supplied from the sense amplifier circuit 11. Further, the data input/output buffer 16 receives an address and command used for selecting a memory cell from the external.

The address register 17 stores an address sent from the data input/output buffer 16 and sends the address to the column decoder 12 and row decoder 14.

The command register 18 stores a command supplied from the data input/output buffer 16 and sends the command as a command signal to the control circuit 19.

The control circuit 19 controls the operation of the NAND flash memory 1. The control circuit 19 receives various control signals from the external. The control signals include chip enable signal CE, write enable signal WE, read enable signal RE, address latch enable signal ALE, command latch enable signal CLE and the like. The control circuit 19 uses the above control signals and a command signal received from the command register 18 to perform operations of reading, programming, erasing and data input/output management. Then, the control circuit 19 sends various control signals required for the above operations to the respective circuits.

FIG. 2 is a circuit diagram showing the configuration of the memory cell array 10. For example, the memory cell array 10 includes a plurality of blocks BLK0 to BLKj. Each block BLK includes a plurality of NAND strings.

Each NAND string is configured by a plurality of memory cell transistors MT (also called memory cells) and two select transistors ST1, ST2. As select transistors ST1, ST2, for example, N-channel MOSFETs (Metal Oxide Semiconductor Field Effect Transistors) are used. Each memory cell transistor MT has a stacked gate structure that includes a charge storage layer (for example, floating gate electrode) formed above a semiconductor substrate with a gate insulating film disposed therebetween and a control gate electrode formed above the charge storage layer with a inter-gate insulating film disposed therebetween. Memory cell transistor MT is not limited to the floating gate structure but may be a MONOS (Metal Oxide Nitride Oxide Silicon) structure that uses a system of trapping electrons in an insulating film (for example, nitride film) as the charge storage layer. Memory cell transistor MT can store data of a plurality of bits according to a variation in the threshold voltage due to a change in the amount of electrons injected into the charge storage layer.

The current paths of memory cell transistors MT adjacent in the NAND string are serially connected. That is, adjacent (m+1) memory cell transistors MT are serially connected in the column direction to share the diffusion region (source region or drain region). The drain on one side of serially connected memory cell transistors MT is connected to the source of select transistor ST1 and the source on the other side thereof is connected to the drain of select transistor ST2.

The control gate electrodes of memory cell transistors MT arranged on the same row are commonly connected to one of word lines WL0 to WLm. The gate electrodes of select transistors ST1, ST2 arranged on the same rows are respectively commonly connected to select gate lines SGD, SGS. The drain of each select transistor ST1 is connected to a corresponding one of bit lines BL0 to BLn. The sources of select transistors ST2 are commonly connected to source line CELSRC.

A plurality of memory cell transistors MT connected to the same word line WL configure a page. Data program and read are simultaneously performed for memory cell transistors MT of one page. Further, the memory cell array 10 is configured to simultaneously erase data items of a plurality of pages and the erase unit is set as a block BLK.

Each bit line BL commonly connects the drains of select transistors ST1 in blocks BLK. That is, the NAND strings arranged on the same column in blocks BLK0 to BLKj are connected to the same bit line BL.

The sense amplifier circuit 11 includes sense amplifiers and data latches (S/A&DL) corresponding in number to bit lines BL0 to BLn. Each bit line BL is connected to the sense amplifier and data latch (S/A&DL) via the select transistor 20. As the select transistor 20, for example, an N-channel MOSFET is used. The on/off state of the select transistor 20 is controlled by bit line selection signal BLS supplied from the column decoder 12.

As the arrangement method of sense amplifiers S/A, even-numbered sense amplifiers S/A may be arranged below the memory cell array 10 and odd-numbered sense amplifiers S/A may be arranged above the memory cell array 10.

Further, the sense amplifier circuit 11 of FIG. 2 corresponds to a configuration example in which one sense amplifier S/A is arranged with respect to one bit line. However, the circuit is not limited to the above configuration example and may correspond to a configuration example in which one sense amplifier S/A is arranged with respect to two bit lines BL and two bit lines BL are selectively switched by means of a select transistor.

(Operation)

In this embodiment, it is assumed that each memory cell can store two-bit data (four-value data). FIG. 3 is a diagram illustrating the threshold voltage distribution of memory cells.

The memory cell is programmed to one of four threshold voltages of an Er level, A level, B level and C level according to data input from the external. The magnitude relationship of the threshold voltages is Er<A<B<C. The operation of programming the memory cell is performed by use of lower-page data and upper-page data.

Two-bit data is defined by "xy" if upper-page data is "x" and lower-page data is "y". The threshold voltage of the memory cell is assigned to, for example, data "11", "01", "00", "10" in an order of voltage levels from the lowest voltage level. The Er level shows an erase state in which the threshold voltage of the memory cell is set to negative, for example.

In the program sequence, a program operation for applying program voltage VPGM to a selected word line and a verify operation for confirming the threshold voltage of the memory cell are repeatedly performed and, for example, the program sequence is terminated when all of the memory cells connected to the selected word line have been programmed, that is, when verify for all of the memory cells connected to the selected word line has passed. The control operation may also be performed to terminate the program sequence when verify for a preset number of memory cells among all of the memory cells connected to the selected word line has passed. A series of operations configured by one program operation and one verify operation is called a program loop. A step-up voltage is added to program voltage VPGM each time the number of program loops increases.

The program operation is performed for each page unit. In the program operation, program voltage VPGM is applied to the selected word line in the selected block, write pass voltage Vpass (for example, 10 V) is applied to the unselected word lines, for example, power source voltage VDD (for example, 2.5 V) is applied to select gate line SGD and ground voltage VSS (0 V) is applied to select gate line SGS.

Prior to the program operation, the bit line is precharged according to write data. Specifically, when "0" data is programmed, the bit line is charged to ground voltage VSS by means of the sense amplifier circuit 11. The bit line voltage is transferred to the channel of a memory cell connected to the selected word line via select transistor ST1 and unselected memory cells. As a result, electrons are injected into the charge storage layer from the channel of the selected memory cell under a condition of the above program operation and the threshold voltage of the memory cell is shifted to the positive side.

When "1" data is programmed (that is, in the case of program inhibition), the bit line is charged to power source voltage VDD by means of the sense amplifier circuit 11. The bit line voltage is reduced by an amount corresponding to the threshold voltage of select transistor ST1 and transferred to the channel of the NAND string and then the channel is made to float. As a result, the channel voltage is raised by capacitive coupling in the above program operation condition and electrons are not injected into the charge storage layer. Therefore, the memory cell holds "1" data. Further, the memory cell that has reached the threshold voltage to be programmed is also inhibited from programming and the threshold voltage is prevented from varying any more by charging the bit line to power source voltage Vdd.

In the first program loop in the four-value data storage system (multi level cell (MLC) system), the bit line connected to the memory cell in which the Er level is held is charged to power source voltage VDD. Further, since the threshold voltages of all of the memory cells that are programmed to levels other than the Er level are shifted to the positive side, the bit lines are charged to ground voltage VSS. The A level among the A, B and C levels of the program state is programmed to the lowest threshold voltage. Since the verify voltage of the B level is higher than that of the A level, higher program voltage VPGM is required to pass verify. Therefore, higher program voltage VPGM is required for the memory cell that is programmed to a higher verify voltage.

For example, in order to pass verify with respect to the memory cell of the B level as early as possible, it is considered to set the first program voltage VPGM higher. However, since program voltage VPGM that is optimum for the memory cell of the B level is excessively high with respect to the memory cell that is programmed to the A level, over-program may occur.

Figure 4:
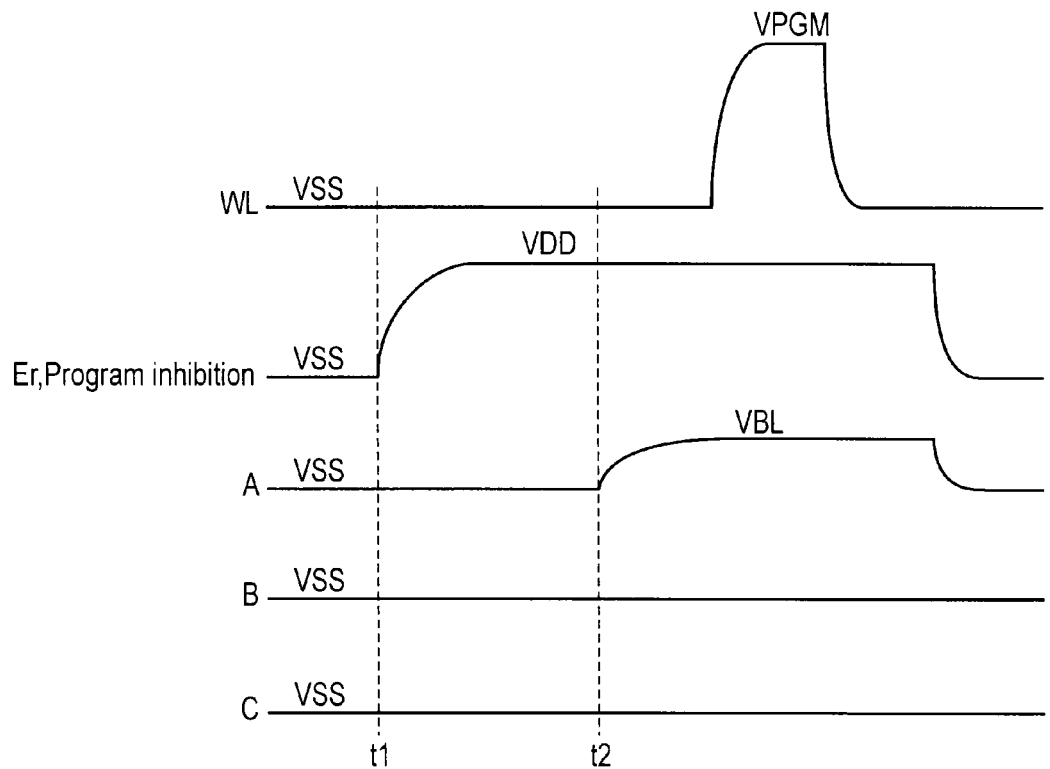
FIG. 4 is a timing chart illustrating bit line voltages in the program operation in the first embodiment.

In order to solve the above problem, in this embodiment, the bit line voltage at the program operation time is controlled as shown in FIG. 4. In the following explanation, the bit line voltage control operation is performed by means of the sense amplifier circuit 11 under control of the control circuit 19.

First, at time t1, the bit lines connected to the memory cells of the Er level and program inhibition are charged to power source voltage VDD. Then, at time t2, the bit line connected to the memory cell programmed to the A level is charged to voltage VBL (for example, 1 V). Further, the bit lines connected to the memory cells programmed to the B and C levels are charged to ground voltage VSS. Then, program voltage VPGM is applied to the selected word line and the memory cell connected to the selected word line is programmed.

FIG. 5 is a circuit diagram showing one example of sense amplifier S/A. Sense amplifier S/A includes a charge transfer transistor 30, PMOSFETs 31, 32, NMOSFETs 33, 34 and data latch DL.

The source of the PMOSFET 31 is connected to power source terminal VDD, the drain thereof is connected to the source of the PMOSFET 32 and the gate thereof is supplied with signal PBC from the control circuit 19. The drain of the PMOSFET 32 is connected to node N and the gate thereof is connected to data latch DL.

The source of the NMOSFET 33 is connected to the drain of the NMOSFET 34, the drain thereof is connected to node N and the gate thereof is connected to data latch DL. The source of the NMOSFET 34 is connected to ground terminal VSS and the gate thereof is supplied with signal NBC from the control circuit 19.

When the bit line is charged, signal PBC is set to a low level and signal NBC is set to a high level to set node N to power source voltage VDD or ground voltage VSS according to data stored in data latch DL.

The charge transfer transistor 30 is configured by, for example, an NMOSFET. One end of the current path of the charge transfer transistor 30 is connected to bit line BL via the select transistor 20 (not shown). The other end of the current path of the charge transfer transistor 30 is connected to node N. BL clamp voltage BLC used for controlling the voltage of bit line BL is applied to the gate of the charge transfer transistor 30 from the control circuit 19. Sense amplifier S/A can charge the bit line to voltage VBL according to BL clamp voltage BLC.

By the above bit line voltage control operation, a voltage of substantially "VPGM−VBL" is applied to the memory cell programmed to the A level. Therefore, over-program of the memory cell programmed to the A level can be suppressed even if the first program voltage VPGM is raised by approximately 1 V in comparison with a case of VBL=0 V.

As shown in FIG. 6, the operation of raising the first program voltage by 1 V means that program loops of 1 V/0.2 V=five times can be reduced if step-up voltage ΔVPGM=0.2 V. As a result, the operation speed of the program sequence can be increased.

(Effect)

As described above in detail, in the first embodiment, the semiconductor memory device 1 includes memory cells that can store multilevel data, for example, four-value data. In a case where the memory cell is programmed to the lowest threshold voltage (A level) among the threshold voltages other than the erase level (Er level), the sense amplifier circuit 11 charges the bit line connected to the memory cell to voltage VBL between a first voltage (for example, VSS) applied to the bit line when the memory cell is programmed to a threshold voltage (B or C level) higher than the A level and a second voltage (for example, VDD) applied to the bit line when the memory cell is inhibited from being programmed.

Therefore, according to the first embodiment, the first program voltage can be raised by voltage VBL. As a result, the number of program loops can be reduced and the operation speed of the program sequence can be increased.

[Second Embodiment]

In the first embodiment, the bit line connected to the memory cell programmed to the A level is charged to voltage VBL after charging the bit line connected to the memory cell of program inhibition to power source voltage VDD. In this case, a time for charging to voltage VBL before applying program voltage VPGM to the word line is required and the program speed is lowered. Further, as shown in FIG. 7, when a first bit line is charged to power source voltage VDD and, at the same time, a second bit line adjacent to the first bit line is charged to voltage VBL, the second bit line may reach a level "VBL+α" higher than or equal to voltage VBL due to coupling until the first bit line is charged to power source voltage VDD after the second bit line reached voltage VBL. In this case, if the voltage of the second bit line becomes excessively high, the channel may be made to float.

By taking the above condition into consideration, in the second embodiment, the operation of charging the bit line connected to the memory cell of program inhibition to power source voltage VDD is performed in a second stage. FIG. 8 is a timing chart illustrating a bit line voltage in the program operation according to the second embodiment. In the following explanation, the bit line voltage control operation is performed by means of the sense amplifier circuit 11 under control of the control circuit 19.

First, in a first stage starting from time t1, the bit lines connected to memory cells of the Er level and program inhibition are charged to a voltage lower than power source voltage VDD, preferably, a voltage of "VDD−VBL". Then, in a second stage starting from time t3, the bit line is charged to power source voltage VDD from voltage "VDD−VBL". At the same time as the second stage, the bit line connected to the memory cell programmed to the A level is charged to voltage VBL.

By the above bit line voltage control operation, the rate of charging to power source voltage VDD and the rate of charging to voltage VBL can be set equal to each other. Therefore, the level of the bit line charged to voltage VBL can be prevented from becoming higher than voltage VBL due to coupling. Further, since the charging operation of voltage VBL is performed in parallel with the charging operation of voltage VDD, that is, since a time for charging to voltage VBL can be included in a time for charging to power source voltage VDD, a bit line charging time can be reduced.

Figure 9:
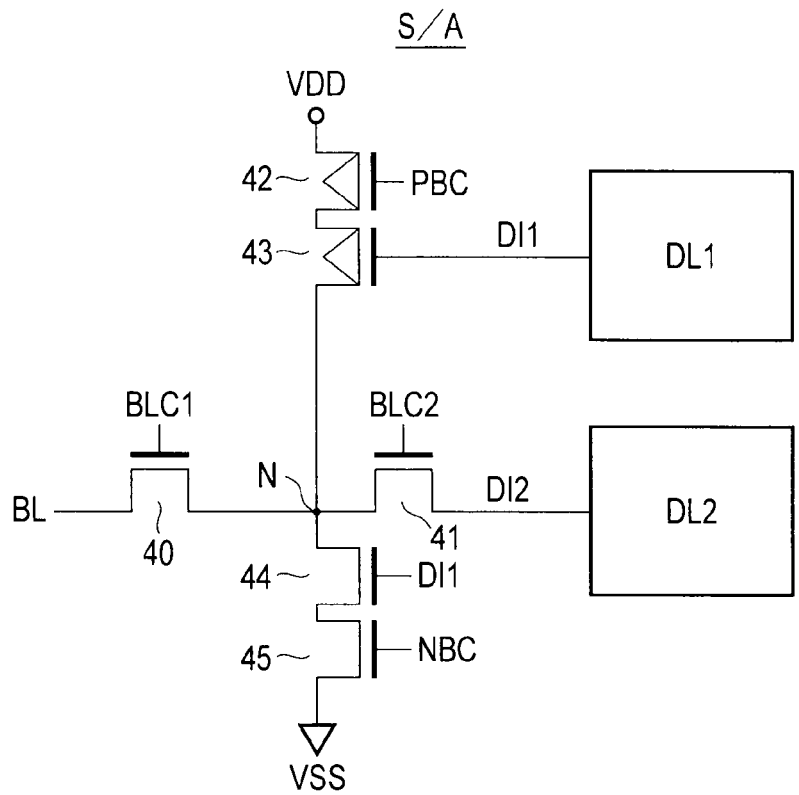
FIG. 9 is a circuit diagram showing the configuration of sense amplifier S/A.

Next, a configuration example of sense amplifier S/A for performing a voltage control operation of the bit line shown in FIG. 8 is explained. FIG. 9 is a circuit diagram showing the configuration of sense amplifier S/A according to the second embodiment.

Sense amplifier S/A includes charge transfer transistors 40, 41, PMOSFETs 42, 43, NMOSFETs 44, 45 and data latches DL1, DL2.

The source of the PMOSFET 42 is connected to power source terminal VDD, the drain thereof is connected to the source of the PMOSFET 43, and the gate thereof is supplied with signal PBC from the control circuit 19. The drain of the PMOSFET 43 is connected to node N, and the gate thereof is connected to data latch DL1 via node DI1.

The source of NMOSFET 44 is connected to the drain of NMOSFET 45, the drain thereof is connected to node N, and the gate thereof is connected to node DI1. The source of NMOSFET 45 is connected to ground terminal VSS, and the gate thereof is supplied with signal NBC from the control circuit 19.

For example, the charge transfer transistors 40, 41 are configured by NMOSFETs. One end of the current path of the charge transfer transistor 40 is connected to bit line BL via the select transistor 20 (not shown), the other end of the current path thereof is connected to node N, and the gate thereof is applied with BL clamp voltage BLC1 from the control circuit 19. One end of the current path of the charge transfer transistor 41 is connected to node N, the other end of the current path thereof is connected to data latch DL2 via node DI2, and the gate thereof is applied with BL clamp voltage BLC2 from the control circuit 19.

Figure 10:
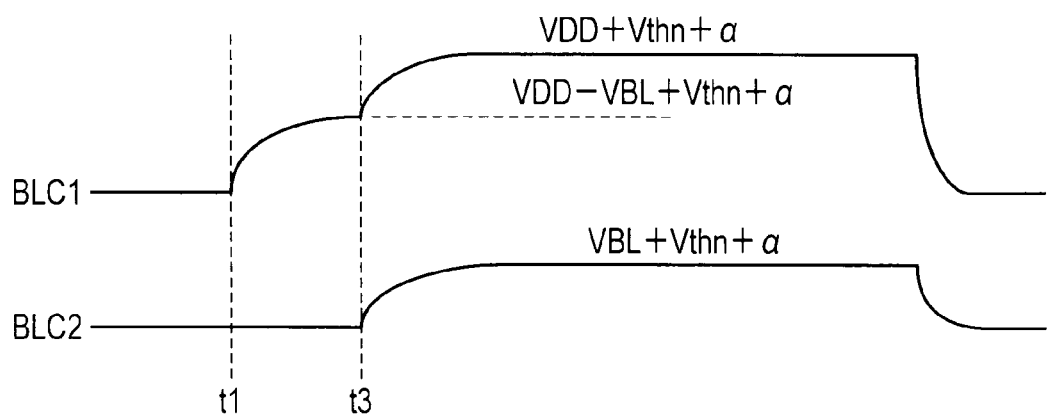
FIG. 10 is a voltage waveform diagram showing BL clamp voltages BLC1 and BLC2.

BL clamp voltages BLC1, BLC2 are controlled as shown in FIG. 10. In FIG. 10, "Vthn" indicates the threshold voltages of the charge transfer transistors 40, 41 and "α" indicates the raised magnitude of the threshold voltage due to the back-bias effect.

Data latch DL1/DL2 is set to attain the voltage of node DI1/DI2 in which Er level=0/1, A level=1/1, B level=1/0 and C level=1/0 according to write data. In a period in which only the BL clamp voltage BLC1 is kept high by setting signal PBC at a low level and setting signal NBC at a high level, the bit line of the Er level is charged from power source terminal VDD and the bit lines of the A, B, C levels are charged from ground terminal VSS.

Subsequently, BL clamp voltage BLC2 is raised after signal NBC is set to a low level. As a result, the charging path for the bit line of the Er level is kept unchanged, but the bit line of the A level is charged to voltage VBL from data latch DL2. Further, the bit lines of the B, C levels are charged to ground voltage VSS from data latch DL2.

As described above, the operations of charging to two different voltage levels (power source voltage VDD and voltage VBL) can be simultaneously performed by controlling sense amplifier S/A.

As described above in detail, according to the second embodiment, the charging time of the bit line can be reduced while the bit line connected to the memory cell of the A level is kept at an optimum voltage. As a result, the operation speed of the program sequence can be increased.

[Third Embodiment]

In the first embodiment, a voltage of substantially "VPGM−VBL" is applied to the memory cell by always charging the bit line connected to the memory cell programmed to the A level to voltage VBL. In the memory cells of the A level, cells that have been rapidly programmed and cells that have been slowly programmed coexist. The program speed can be increased by applying higher program voltage VPGM to the cells to be slowly programmed. Since the threshold voltage of the memory cell of the C level is higher than that of the A level, the final program end time is set to the program end time of the memory cell of the C level, but the number of verify operations for the memory cell of the A level can be more reduced by rapidly terminating the program operation for the memory cell of the A level. As a result, the operation speed of the program sequence can be increased.

By taking the above situation into consideration, in the third embodiment, memory cells of a lower program speed and memory cell of a higher program speed are determined. In the next program loop, the bit line is charged to ground voltage VSS with respect to the memory cells of the lower program speed, and the bit line is charged to voltage VBL with respect to the memory cells of the higher program speed.

Figure 11:
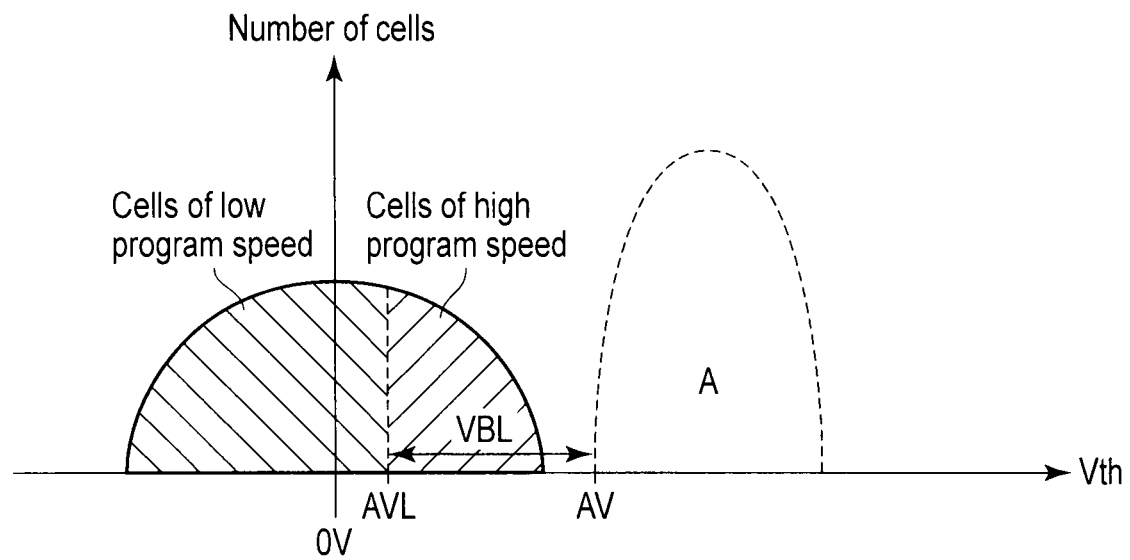
FIG. 11 is a diagram illustrating the threshold voltage distribution after a first program voltage is applied to a memory cell of an A level.

FIG. 11 is a diagram illustrating the threshold voltage distribution after a first program voltage is applied to the memory cell of the A level. In order to determine a memory cell of a lower program speed, the verify operation is performed by use of verify voltage AVL, for example, "AVL=AV−VBL" that is lower than verify voltage AV used for verifying the memory cell of the A level. At this time, the memory cell having the threshold voltage lower than verify voltage AVL charges the bit line to ground voltage VSS at the next program voltage application time. Further, the memory cell having the threshold voltage not lower than verify voltage AVL charges the bit line to voltage VBL at the next program voltage application time. As a result, since program voltage VPGM is applied to the memory cell of the lower program speed, the program speed can be increased.

Figure 12:
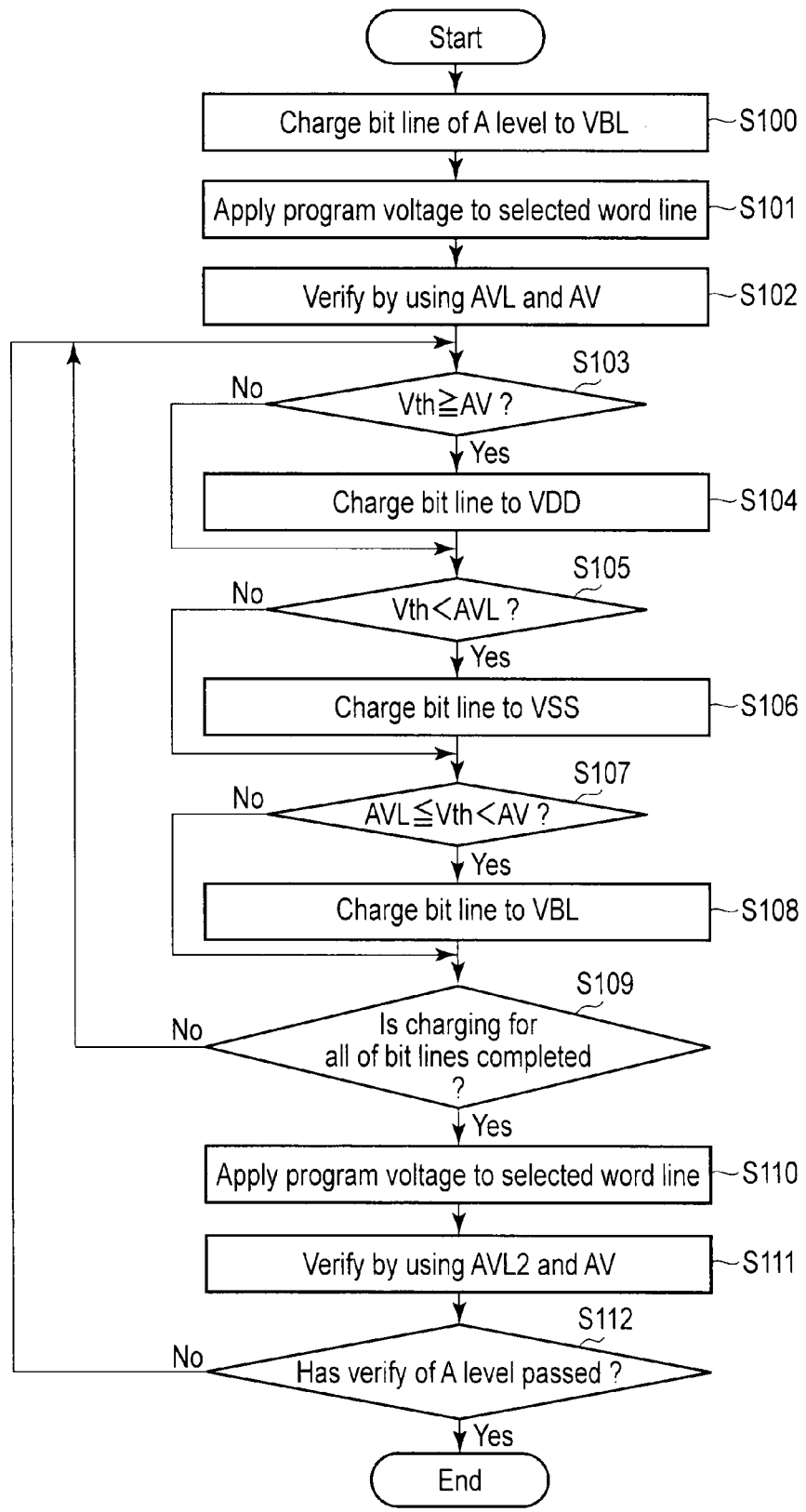
FIG. 12 is a flowchart illustrating a program sequence.

Next, the program sequence according to the third embodiment is explained. FIG. 12 is a flowchart illustrating the program sequence. In the following explanation, the bit line voltage control operation is performed by means of the sense amplifier circuit 11 under control of the control circuit 19.

First, like the first embodiment, in the first program loop, the bit line connected to a memory cell to be programmed to an A level is charged to voltage VBL (step S100). Then, a row decoder 14 applies first program voltage VPGM to a selected word line (step S101).

Next, a verify operation is performed by use of two verify voltages AVL and AV with respect to the memory cell programmed to the A level (step S102). The verify operation is basically the same as the read operation. That is, the row decoder 14 applies verify voltage AVL to the selected word line and applies a read pass voltage that turns on the memory cells irrespective of stored data to unselected word lines. In this state, the sense amplifier circuit 11 determines whether or not a current flows in the NAND string to determine threshold voltage Vth of a selected memory cell. The verify operation using verify voltage AV is the same as the operation using verify voltage AVL except that the verify voltage applied to the selected word line is different. In step S102, a memory cell of a low program speed (a memory cell having the threshold voltage lower than verify voltage AVL) and a memory cell of a high program speed (a memory cell having the threshold voltage not lower than verify voltage AVL) are determined.

Figure 13:
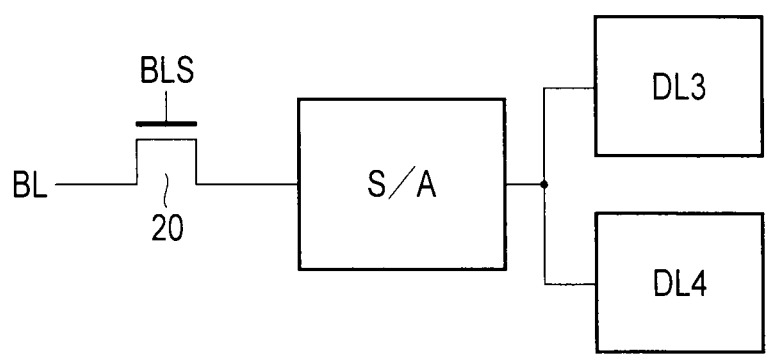
FIG. 13 is a block diagram showing the configurations of sense amplifier S/A and data latch DL.

The verify results of verify voltages AVL and AV are stored in data latch DL. FIG. 13 is a block diagram showing the configurations of sense amplifier S/A and data latch DL connected to one bit line. Sense amplifier S/A and data latch DL are included in the sense amplifier circuit 11. Sense amplifier S/A is connected to the bit line via a select transistor 20. Data latches DL3 and DL4 for verify are connected to sense amplifier S/A. In this embodiment, the verify result of verify voltage AVL is stored in data latch DL3 and the verify result of verify voltage AV is stored in data latch DL4.

Next, a second program loop is performed. The memory cell programmed to a threshold voltage higher than or equal to verify voltage AV in the first program loop is inhibited from being programmed and charges the bit line to power source voltage VDD (steps S103, S104). The memory cell programmed to a threshold voltage lower than verify voltage AVL in the first program loop charges the bit line to ground voltage VSS (steps S105, S106). The memory cell programmed to a threshold voltage higher than or equal to verify voltage AVL and lower than verify voltage AV in the first program loop charges the bit line to voltage VBL (steps S107, S108). The control operation of steps S103 to S108 is performed based on data in data latches DL3 and DL4.

When the operation of charging all of the bit lines is completed (step S109), the row decoder 14 applies second program voltage VPGM higher than the first program voltage by a step-up voltage to the selected word line (step S110). Then, the verify operation using two verify voltages AVL2 and AV is performed with respect to the memory cell programmed to the A level (step S111). The verify voltages AVL2 is higher than verify voltage AVL and lower than verify voltage AV.

In the program sequence after the above step, a process of steps S103 to S111 is repeatedly performed until verify for all of the memory cells of the A level passes (step S112). After this, memory cells of B and C levels are programmed by performing a general program operation.

As described above in detail, in the third embodiment, the bit line connected to the memory cells of the lower program speed is charged to ground voltage VSS. Therefore, since program voltage VPGM is applied to the memory cells of the lower program speed at the program operation time, the program time of the memory cells of the lower program speed can be reduced. As a result, since the number of program loops can be reduced, the operation speed of the program sequence can be increased.

In each of the above embodiments, a case wherein the memory cell stores four-value data (2-bit data) as multilevel data is explained as an example. However, it is, of course, also possible to permit the memory cell to store data of three or more bits.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array including a plurality of memory cells configured to store a plurality of bits, threshold voltages of the memory cells being set lowest in an erase state and sequentially set higher according to data in a program state;
a plurality of bit lines connected to the memory cells;
a word line connected to the memory cells; and
a control circuit configured to execute a program operation by repeating a plurality of program loops in which a program voltage is stepped up, wherein
in a case where a first memory cell is programmed to a first threshold voltage that is lowest among threshold voltages in the program state, the control circuit is configured to charge a first bit line connected to the first memory cell to a third voltage between a first voltage applied to a bit line when a memory cell is programmed to a second threshold voltage higher than the first threshold voltage and a second voltage applied to a bit line when a memory cell is inhibited from being programmed, and
the control circuit is configured to charge the first bit line to the third voltage from a first program loop in the program loops to a second program loop in which the first memory cell has been programmed.

2. The device of claim 1, wherein the control circuit charges a bit line connected to a memory cell programmed to the second threshold voltage to the first voltage, and charges a bit line connected to a memory cell that is inhibited from being programmed to the second voltage.

3. The device of claim 1, further comprising a row decoder configured to apply a program voltage to the word line.

4. The device of claim 1, wherein
in a case where a second bit line connected to a second memory cell that is inhibited from being programmed is charged to the second voltage, the control circuit executes a first stage in which the second bit line is charged to a fourth voltage lower than the second voltage and a second stage in which the second bit line is charged to the second voltage, and
the control circuit starts to charge the first bit line after the first stage.

5. The device of claim 4, wherein the fourth voltage is a voltage obtained by subtracting the third voltage from the second voltage.

6. A nonvolatile semiconductor memory device comprising:
a memory cell array including a plurality of memory cells configured to store a plurality of bits, threshold voltages of the memory cells being set lowest in an erase state and sequentially set higher according to data in a program state;

a plurality of bit lines connected to the memory cells;

a word line connected to the memory cells; and a control circuit configured to execute a program operation by repeating a plurality of program loops in which a program voltage is stepped up, each of the program loops including a verify operation in which threshold voltages of the memory cells are verified, wherein in a case where a first memory cell is programmed to a first threshold voltage that is lowest among threshold voltages in the program state, the control circuit is configured to charge a first bit line connected to the first memory cell to a third voltage between a first voltage applied to a bit line when a memory cell is programmed to a second threshold voltage higher than the first threshold voltage and a second voltage applied to a bit line when a memory cell is inhibited from being programmed, the control circuit is configured to verify the threshold voltages of the memory cells by using a first verify voltage for verifying the first threshold voltage and a second verify voltage lower than the first verify voltage after a program voltage is applied to the word line in a first program loop, and the control circuit is configured to charge a bit line connected to a memory cell having a threshold voltage lower than the second verify voltage to the first voltage in a second program loop next to the first program loop.

7. The device of claim 6, wherein the control circuit charges a bit line connected to a memory cell having a threshold voltage that is not lower than the second verify voltage to the third voltage.

8. The device of claim 6, wherein the second verify voltage is a voltage obtained by subtracting the third voltage from the first verify voltage.

9. The device of claim 6, wherein a step-up voltage is added to the program voltage for each program loop.

10. The device of claim 6, further comprising a row decoder configured to apply a verify voltage to the word line.

11. The device of claim 1, wherein
the first voltage is a ground voltage, and
the second voltage is a power source voltage.

12. The device of claim 1, wherein
the memory cell array includes a plurality of NAND strings,
each of the NAND strings includes a plurality of memory cells connected in series, and
the NAND strings are respectively connected to the bit lines.

13. The device of claim 1, wherein each of the memory cells includes a charge storage layer.

14. The device of claim 6, wherein
the first voltage is a ground voltage, and
the second voltage is a power source voltage.

15. The device of claim 6, wherein
the memory cell array includes a plurality of NAND strings,
each of the NAND strings includes a plurality of memory cells connected in series, and
the NAND strings are respectively connected to the bit lines.

16. The device of claim 6, wherein each of the memory cells includes a charge storage layer.

* * * * *